United States Patent
Martinez

(10) Patent No.: US 10,928,624 B2
(45) Date of Patent: Feb. 23, 2021

(54) MICROELECTROMECHANICAL SYSTEM (MEMS) STRUCTURE AND METHOD OF FORMATION

(71) Applicant: TEXAS INSTRUMENTS INCORPORATED, Dallas, TX (US)

(72) Inventor: Jose A. Martinez, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 277 days.

(21) Appl. No.: 16/008,442

(22) Filed: Jun. 14, 2018

(65) Prior Publication Data

US 2019/0204586 A1    Jul. 4, 2019

Related U.S. Application Data

(60) Provisional application No. 62/612,262, filed on Dec. 29, 2017.

(51) Int. Cl.
| | |
|---|---|
| *G02B 26/08* | (2006.01) |
| *B81C 1/00* | (2006.01) |
| *B81B 7/02* | (2006.01) |
| *G09G 3/34* | (2006.01) |

(52) U.S. Cl.
CPC ............ *G02B 26/0841* (2013.01); *B81B 7/02* (2013.01); *B81C 1/00047* (2013.01); *B81B 2201/042* (2013.01); *B81C 2201/0132* (2013.01); *B81C 2201/0133* (2013.01); *G09G 3/346* (2013.01)

(58) Field of Classification Search
None
See application file for complete search history.

(56) References Cited

U.S. PATENT DOCUMENTS

| | | | | | |
|---|---|---|---|---|---|
| 5,506,171 | A | * | 4/1996 | Leonard | G02B 26/0841 216/14 |
| 5,535,047 | A | * | 7/1996 | Hornbeck | G02B 26/0841 359/295 |
| 5,583,688 | A | * | 12/1996 | Hornbeck | G02B 26/0841 359/291 |
| 5,703,728 | A | * | 12/1997 | Smith | G02B 26/0841 359/871 |
| 5,771,116 | A | * | 6/1998 | Miller | G02B 26/0841 359/224.1 |
| 5,943,157 | A | * | 8/1999 | Florence | G02B 26/0841 359/224.1 |
| 7,139,113 | B1 | * | 11/2006 | Chu | G02B 26/0841 359/291 |

(Continued)

OTHER PUBLICATIONS

Cuiling Gong and Tim Hogan; CMOS Compatible Fabrication Processes for the Digital Micromirror Device; IEEE Journal of the Electron Devices Society, vol. 2, No. 3, May 2014.

(Continued)

*Primary Examiner* — Jennifer D. Carruth
(74) *Attorney, Agent, or Firm* — Michelle F. Murray; Charles A. Brill; Frank D. Cimino

(57) ABSTRACT

A microelectromechanical system (MEMS) structure includes at least first and second metal vias. Each of the first and second metal vias includes a respective planar metal layer having a first thickness and a respective post formed from the planar metal layer. The post has a sidewall, and the sidewall has a second thickness greater than 14% of the first thickness.

20 Claims, 5 Drawing Sheets

(56) References Cited

U.S. PATENT DOCUMENTS

| | | | |
|---|---|---|---|
| 7,262,900 B2 | 8/2007 | DiCarlo et al. | |
| 7,375,874 B1* | 5/2008 | Novotny | B81C 1/00238 |
| | | | 216/2 |
| 7,561,334 B2* | 7/2009 | Luo | B81B 3/007 |
| | | | 345/108 |
| 8,541,850 B2* | 9/2013 | Gupta | H03H 3/0073 |
| | | | 257/414 |
| 9,335,540 B2 | 5/2016 | Sherwin et al. | |
| 2005/0074919 A1* | 4/2005 | Patel | B81C 1/00269 |
| | | | 438/107 |
| 2009/0130303 A1* | 5/2009 | Mezenner | G02B 26/0841 |
| | | | 427/162 |
| 2013/0127879 A1* | 5/2013 | Burns | G01L 19/148 |
| | | | 345/501 |
| 2013/0135317 A1* | 5/2013 | Shenoy | B81C 1/00301 |
| | | | 345/501 |
| 2013/0222351 A1* | 8/2013 | Kao | G02B 26/001 |
| | | | 345/205 |
| 2014/0311912 A1* | 10/2014 | Shih | G01F 1/692 |
| | | | 205/81 |
| 2015/0048514 A1* | 2/2015 | Tang | H01L 21/76801 |
| | | | 257/774 |
| 2015/0268461 A1* | 9/2015 | Murarka | B81C 1/00158 |
| | | | 359/224.1 |

OTHER PUBLICATIONS

Cuiling Gong and Tim Hogan; Fabrication Processes for the DMD Digital Micromirror Device; IEEE Journal of Microelectromechanical Systems. Jun. 2013.

\* cited by examiner

MICROELECTROMECHANICAL SYSTEM (MEMS) STRUCTURE AND METHOD OF FORMATION

CROSS-REFERENCE TO RELATED APPLICATIONS

The present application claims priority to U.S. Provisional Patent Application No. 62/612,262, filed Dec. 29, 2017, titled "Decoupling Metal Deposition Inside Via Support From Above Via Support," which is hereby incorporated herein by reference in its entirety.

BACKGROUND

Microelectromechanical system (MEMS) devices are useful in various applications, such as sensors and display systems. A digital micromirror device (DMD) is a MEMS device that includes an array of micromirrors fabricated over an underlying structure for setting the positions of the micromirrors. One component of a DMD is a micromirror, which includes a metal sheet formed on a via attached to a hinge. Additional vias may be formed in a DMD to provide structural support and/or electrical conductivity between the various components of the DMD. A via may include a cylindrical (or other cross-sectional shape) post. One or more of the vias of a DMD may include metal. For example, the metal including a via may be formed using a vapor deposition process.

SUMMARY

In one example, a microelectromechanical system (MEMS) structure includes at least first and second metal vias. Each of the first and second metal vias includes a respective planar metal layer having a first thickness and a respective post formed from the planar metal layer. The post has a sidewall, and the sidewall has a second thickness greater than 14% of the first thickness.

In another example, a method of forming the vias includes forming a spacer layer on a substrate, forming a cavity in the spacer layer, and forming a first metal layer on the spacer layer and in the cavity. In this example, the method further includes forming a polymer layer on the first metal layer and into the cavity covering the first metal layer in the cavity. The method also includes removing a first portion of the polymer layer to leave a second portion of the polymer layer in the cavity, removing a first portion of the first metal layer to leave a second portion of the first metal layer in the cavity, removing the second portion of the polymer layer from the cavity, and forming a second metal layer on the spacer layer and into the cavity covering the second portion of the first metal layer.

In yet another example, a method of forming the vias includes, on a spacer layer containing a cavity, forming a first metal layer on the spacer layer and into the cavity. The method in this example also includes applying a photoresist onto the first metal layer and into the cavity covering the first metal layer in the cavity, removing a first portion of the photoresist to leave a second portion of the photoresist in the cavity continuing to cover the first metal layer in the cavity, removing a first portion of the first metal layer to leave a second portion of the first metal layer in the cavity, and removing the second portion of the uncured photoresist from the cavity. The method further includes forming a second metal layer on the spacer layer and into the cavity covering the second portion of the first metal layer, and removing the spacer layer to form a metal via, the metal via having a sidewall. The thickness of the sidewall of the metal via is least 20% of a thickness of the second metal layer outside the metal via.

DETAILED DESCRIPTION

As described hereinabove, metal vias may be formed by a vapor deposition process, such as physical vapor deposition (PVD). As a result of the vapor deposition process, the thickness of the vias' sidewalls may be substantially smaller than the thickness of the metal at the top of the via. For example, the metal at the top of the via may have a thickness of 350 angstroms (Å), while the sidewall thickness may only be 50 Å. Thus, the sidewall thickness may be only 1/7 (about 14%) of the thickness of the metal at the top of the via. As a result, the structural stability of the via may be compromised. Further, for a via that also provides electrical connectivity, the relatively thin sidewall thickness of the via may impair its electrical properties (e.g., the via's resistance may be higher than otherwise desired).

The described examples include a technique for forming vias that have increased sidewall thickness relative to the metal at the top of the via. In one example, the sidewall thickness is more than 14% of the thickness of the metal at the top of the via. In another example, the sidewall thickness is more than 20% of the thickness of the metal at the top of the via. In yet another example, the sidewall thickness is at least 28% of the thickness of the metal at the top of the via. The described examples include a description of a DMD and a via formation technique.

Figure 1:
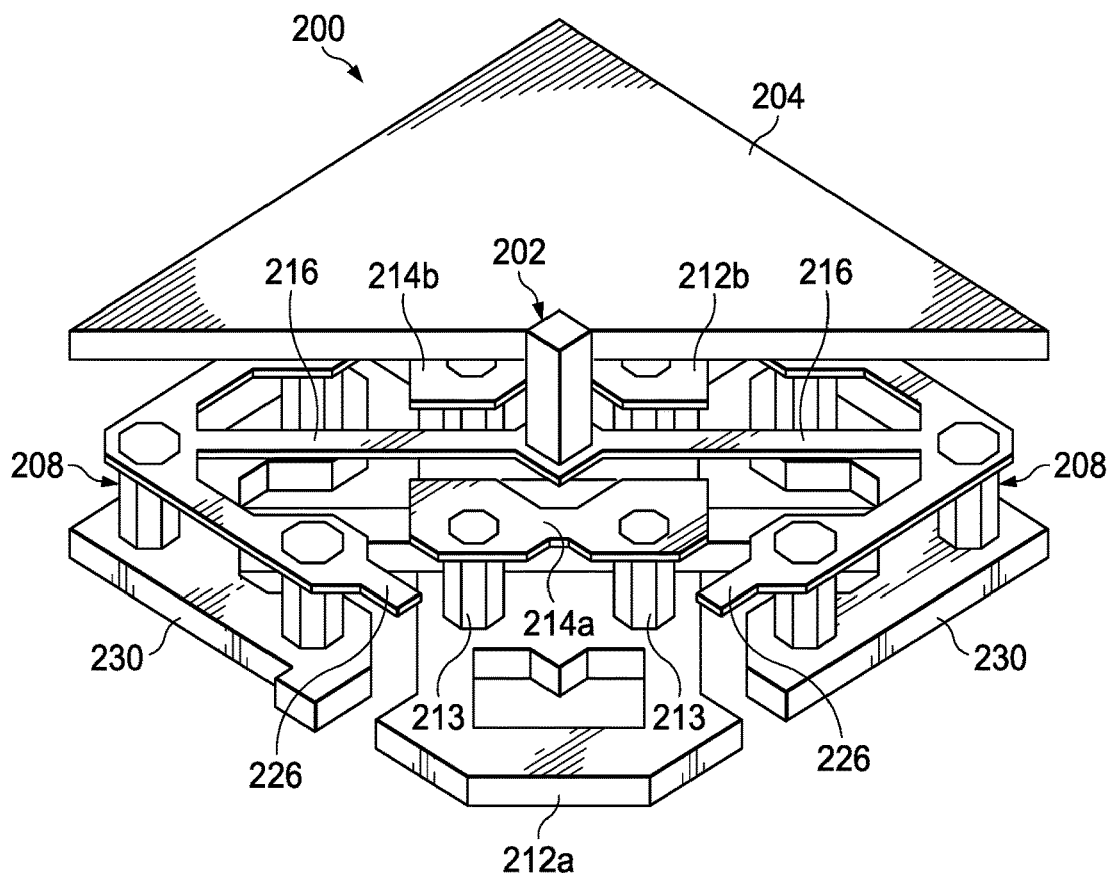
FIG. 1 illustrates a digital micromirror device (DMD) in accordance with the described examples.

A DMD includes an array of mirrors (also referenced as micromirrors herein) with each mirror mechanically and electrically coupled to a corresponding torsion hinge by way of a conductive via. Each mirror can be made to rotate to one position or another (e.g., +/−12 degrees) or to a neutral position through application of suitable voltages to electrodes. FIG. 1 illustrates a single DMD pixel element 200. An array of such pixel elements may be formed on a common semiconductor die. The DMD pixel element 200 of FIG. 1 may include a hinge portion, an address portion, and a mirror portion. The hinge portion includes a hinge 216 (which may be a torsion hinge), supported on each side by hinge posts. Six bias vias 208 support spring tips 226 (two of which are shown in FIG. 1 and two more are present but hidden in this view) and hinge 216 above the lower layer (also referenced as a "substrate") 230. The bias vias 208 may also operate to relay a bias voltage to hinge 216. A micromirror 204 is supported above the hinge 216 by a mirror via 202. The hinge 216 at the base of mirror via 202 may be referred to as a substrate. In addition to providing support for the micromirror 204, the mirror via 202 may conductively transfer the bias voltage to the micromirror 204. The bias voltage may be conductively transferred to the spring tips 226 and hinge 216 through the six bias vias 208. The bias voltage may be further transferred from the hinge 216 to the micromirror 204 through the mirror via 202.

The address portion of the DMD pixel element 200 includes two address pads 212a, 212b (collectively address pads 212) that each connect to raised address electrodes 214a, 214b, respectively. As illustrated in FIG. 1, address vias 213 support the raised address electrodes 214a, 214b above each address pad 212a, 212b (which also may be referred to as substrates). In addition to supporting the raised address electrodes 214a, 214b, the address vias 213 relay a control or address voltage from the address pads 212a, 212b to the raised address electrodes 214a, 214b. The address pads 212a, 212b may be in communication with control circuitry, such as a static random access memory (SRAM) cell or the like, which selectively applies a control or address voltage to one of the two address pads 212a, 212b to create an electrostatic force between the micromirror 204 and the raised address electrodes 214a, 214b. A similar electrostatic force may be created between the micromirror 204 and the address pads 212a, 212b.

The range of motion of the micromirror 204 may be limited by spring tips 226. During operation of DMD pixel element 200, spring tips 226 provide a landing point for micromirror 204. For example, when micromirror 204 is tilted in the direction of the raised address electrode 214a and address pad 212a, the spring tips 226 positioned proximate these address elements operate as a landing point for micromirror 204. Conversely, when micromirror 204 is tilted in the direction of the raised address electrode 214b and address pad 212b, the spring tips 226 on the opposite side (and hidden in the view of FIG. 1) positioned proximate these address elements operate as a landing point for micromirror 204. Thus, micromirror 204 may be tilted in the positive or negative direction until the micromirror 204 contacts one or more spring tips 226. As described hereinabove, the base of the various vias 202, 208, and 213 may be referred to as substrate.

FIGS. 2-15 illustrate a technique for fabricating one or more of the vias of FIG. 1. FIGS. 2-8 describe the formation of two of the bias vias 208, but the technique applies to the formation of the address vias 213 as well. FIGS. 9-15 describe the formation of mirror via 202 and generally uses the same process flow as for the formation of the bias and address vias 208 and 213.

Figure 2:
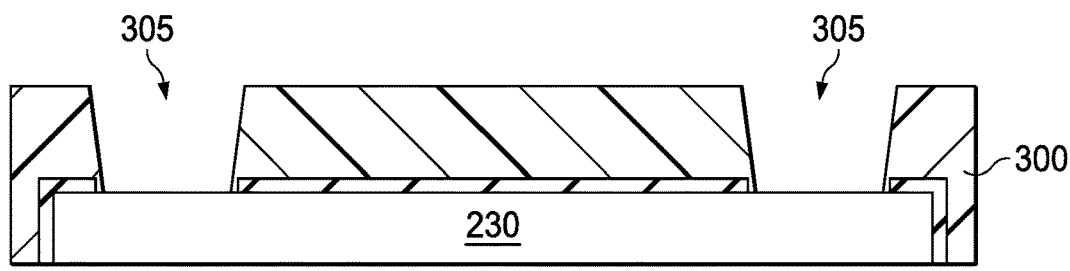
FIGS. 2-8 illustrate a process flow for forming address and bias vias in the DMD of FIG. 1 in accordance with the described examples.

Referring to FIG. 2, the via formation technique includes forming a spacer layer 300 on a substrate (e.g., lower layer 230 in FIG. 1). This process step may be performed by applying a photoresist layer to the substrate and patterning it through a photolithographic process. The photoresist may be a curable photoresist and may be cured through the application of heat and ultraviolet (UV) light. Non-photosensitive materials can be used as well to form the spacer layer, such as spin on glass (SOG), silicon dioxide, or silicon nitride. The curing process causes the photoresist including the spacer layer 300 to harden and be able to withstand further processing for form the vias. FIG. 2 also shows that cavities 305 are formed in the spacer layer 300. Vias 208 and 213 will be formed inside cavities 305.

Figure 3:
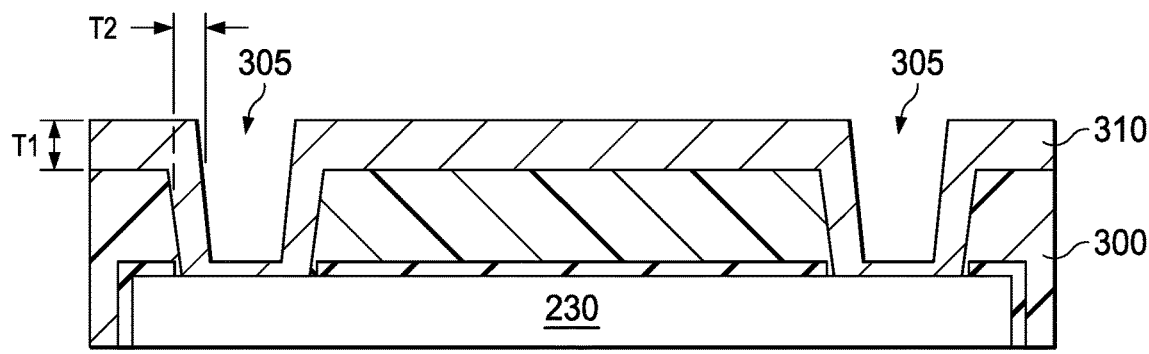

In FIG. 3, a metal layer 310 has been formed on the spacer layer 300. In one example, metal layer 310 may be formed by a PVD process. The thickness of the metal layer 310 at the top of the cavities 305 is designated as T1 and the thickness of the metal along the sides of the cavities is designate as T2. T1 is larger than the thickness of the metal layer 330 (FIG. 8) at the top of the cavities 305 towards the end of the formation process of the via. That is, more metal is deposited on spacer layer 300 than is needed for the resulting DMD structure. The additional metal deposited during this step of the process flow, however, results in a sufficient thickness T2 of metal along the sidewalls of the cavities. Thus, an amount of metal is deposited in FIG. 3 to result in T2 having sufficient, or nearly sufficient, thickness despite T1 being too large for the resulting DMD structure. As described hereinbelow, the metal of metal layer 310 outside the cavities will be removed.

Figure 4:
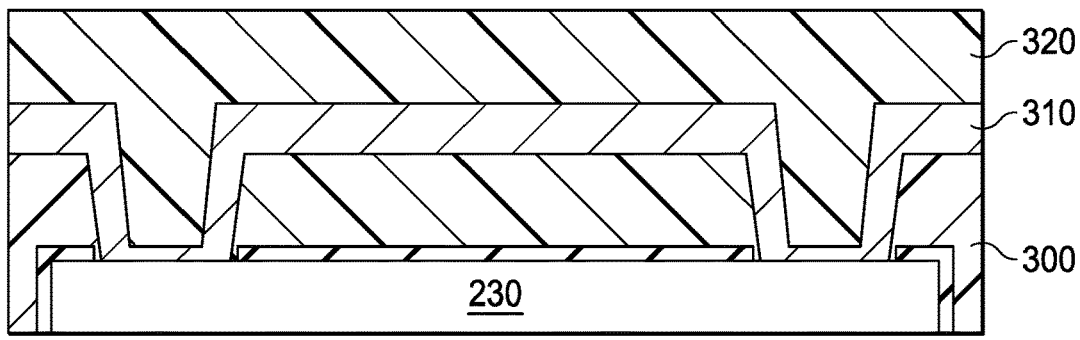

As shown in FIG. 4, a polymer layer 320 is formed on the metal layer 310 and in the cavities 305. In one example, the polymer layer 320 may include the same material as spacer layer 300. For example, polymer layer 320 may include a photoresist. However, unlike spacer layer 300, polymer layer 320 is not UV-cured. In some implementations, the polymer layer 320 may include a bottom antireflective coating (BARC) or a gap filler material. The polymer layer 320 will function, as described hereinbelow, to protect the metal layer 310 in the cavities 305 as the rest of the metal layer 310 (outside the cavities) is removed.

Figure 5:
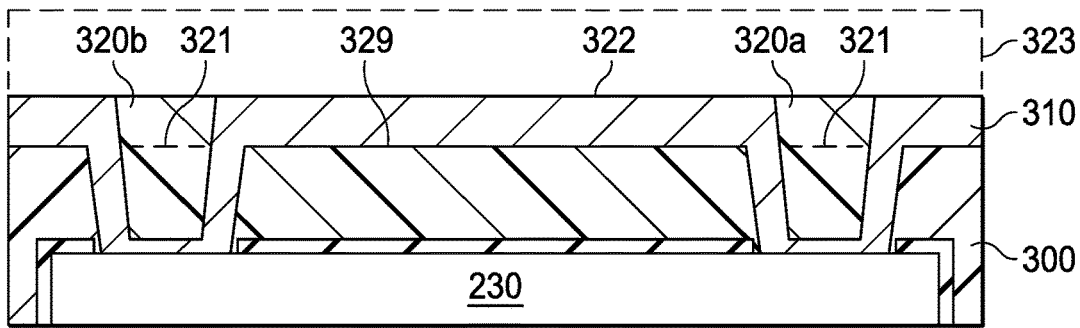

FIG. 5 illustrates the next process operation in which a portion 323 (shown in dashed outline) of the polymer layer 320 is removed down to the upper surface 322 of the metal layer 310, thereby leaving polymer "plugs" 320a and 320b. The polymer removal process may include placing the structure of FIG. 4 in a plasma chamber (also called a reactor) that includes a gas such as oxygen that reacts with organic materials such as the polymer layer 320. The polymer layer 320 is "ashed" during this process. The structure is exposed to the polymer-removing plasma long until the dashed portion 323 of the polymer layer 320 is removed. In some implementations, the structure is continued to be exposed to the polymer-removing plasma to remove some of the polymer within the cavity, down to line 321 which is approximately even with the upper surface 329 of the spacer layer 300. The position of line 321 helps define the final height of 310a and 310b (FIG. 6).

Figure 6:
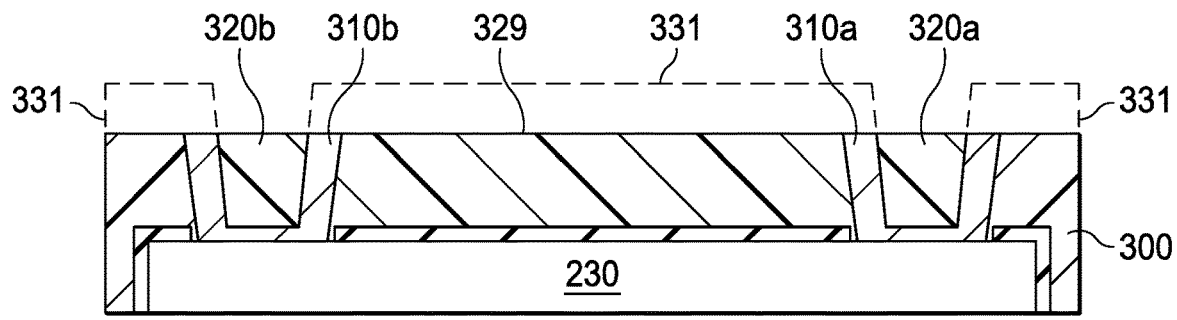

FIG. 6 illustrates the next process operation in which a portion 331 (in dashed outline) of the metal layer 310 is removed down to surface 329 of the spacer layer 300. The etching process for this operation may be a dry etch process or a wet etch process (e.g., using a chlorine-based wet etchant material). Because the metal 310a and 310b within the cavity was covered by the polymer plugs 320a and 320b, the metal-removing process was unable to remove the metal 310a and 310b within the cavities. At this point, the metal including the sidewalls of the cavities has approximately the target thickness desired for the resulting vias.

Figure 7:
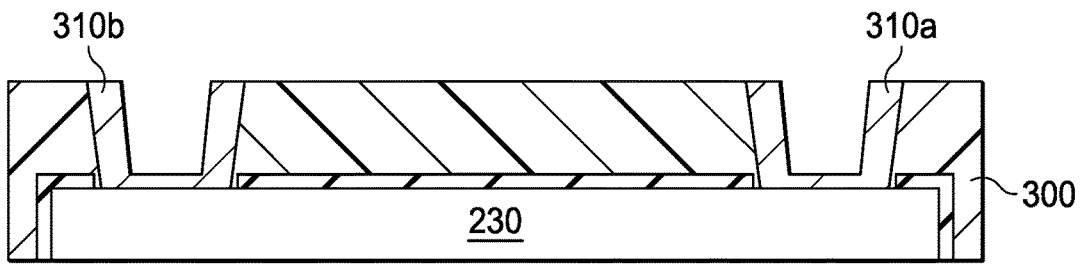
Figure 8:
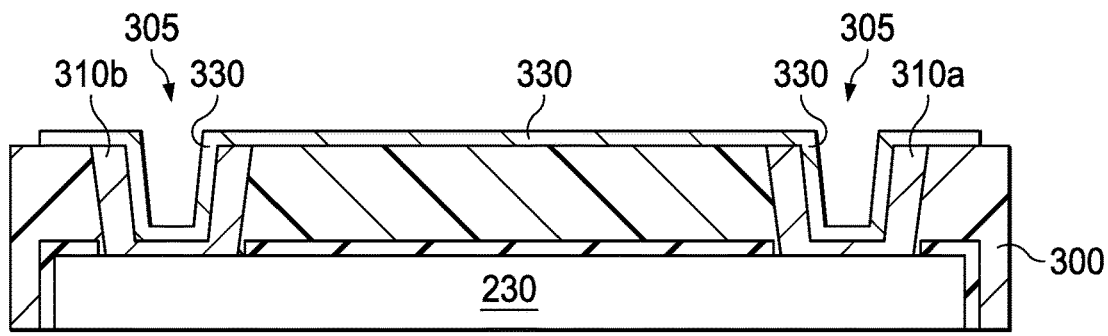

The polymer plugs 320a and 320b within the cavities are then removed as illustrated in FIG. 7. As the polymer layer 320 was never cured, plugs 320a and 320b can be removed by rinsing the sample with a solvent such as propylene glycol methyl ether acetate (PGMEA). An additional cleaning process can then be performed to clean the inner surface of the metal 310a and 310b in the cavities to ensure they are residue free. This can be accomplished by performing a short oxygen plasma ash. With the polymer plugs removed, another metal layer 330 is formed on the spacer layer 300 and into the cavities 305 (FIG. 8). The metal of metal layer 330 covers the metal 310a and 310b within the cavities and thus adds to the sidewall thickness of the resulting via. Metal layer 330 can be formed by a PVD process, with an optional pre-sputter cleaning which would further improve the electrical performance of the via. The relative thicknesses of the via metal are further described hereinbelow with respect to FIG. 15.

Figure 9:
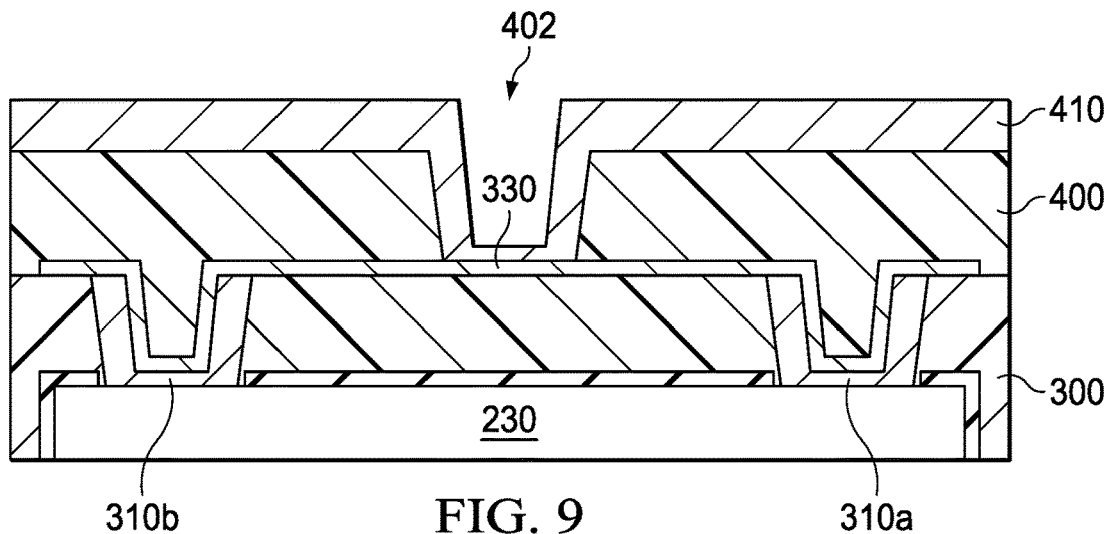
FIGS. 9-14 illustrate a process flow for forming the mirror via in the DMD of FIG. 1 in accordance with the described examples.

FIGS. 9-14 illustrate a process flow (similar to that described hereinabove) to form the mirror via 202. As shown in FIG. 9, a second spacer layer 400 is formed on the metal layer 330. The composition and formation of spacer layer 400 may be the same as for spacer layer 300 described hereinabove. A cavity 402 is formed in the spacer layer 400 using a process that is the same or similar as for the formation of cavities 305. Also, FIG. 9 shows that a metal layer 410 has been formed on spacer layer 400 and in the cavity 402. Metal layer 410 may be formed as described hereinabove with regard to metal layer 310 and may have the same thicknesses as described hereinabove.

Figure 10:
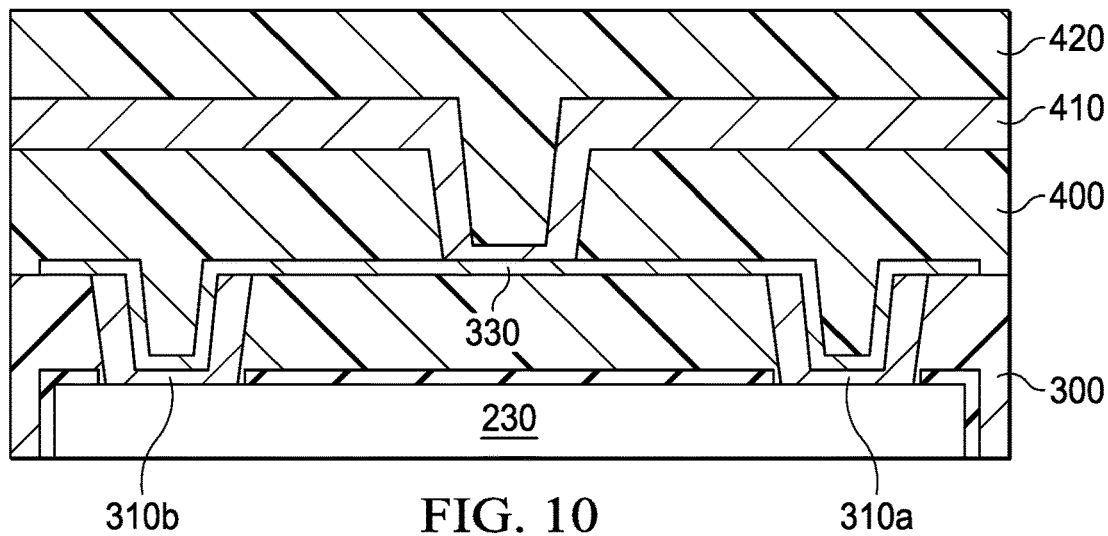
Figure 11:
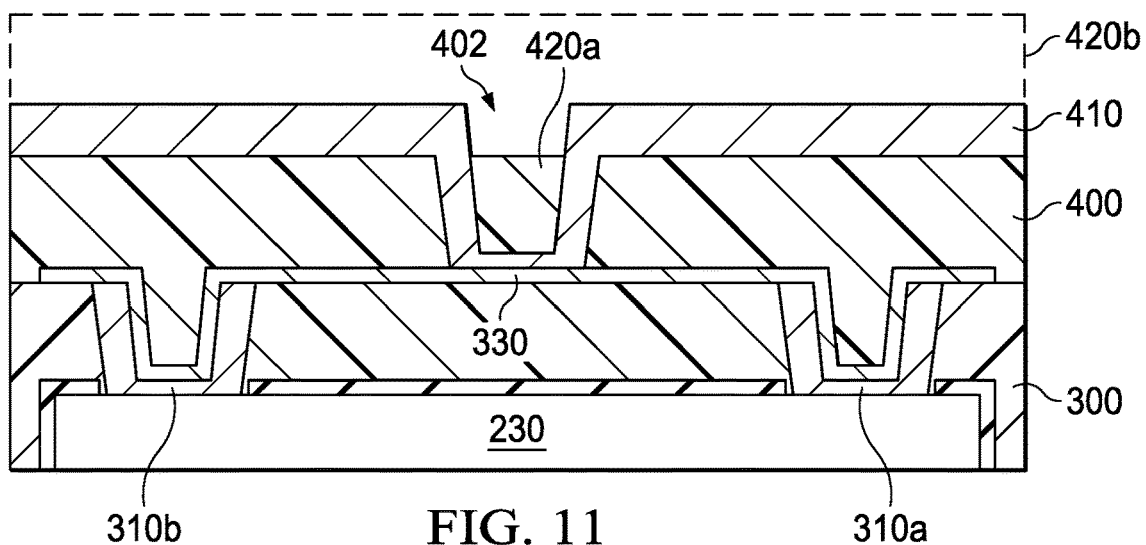
Figure 12:
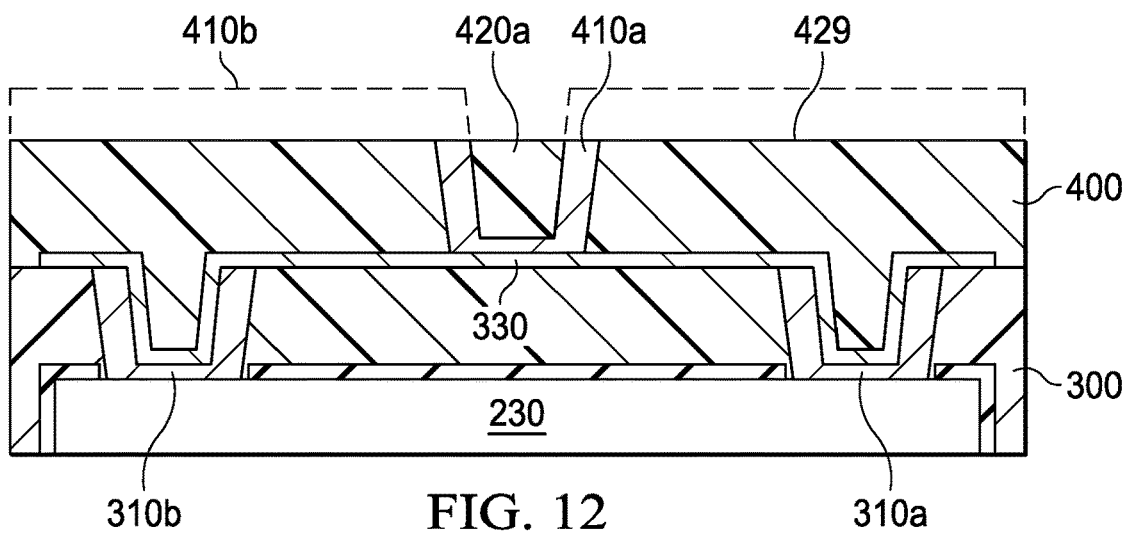

FIG. 10 illustrates the formation of another polymer layer 420 (e.g. a photoresist, BARC, gap filler material, etc.) that is uncured, as was the case for polymer layer 320. FIG. 11 shows that a portion 420b of polymer layer 420 is removed as described hereinabove, resulting in polymer plug 420a within the cavity 402. FIG. 12 illustrates the next process operation in which a portion 410b of the metal layer 410 is removed down to surface 429 of the spacer layer 400. This metal-removing process may be performed similar to that described hereinabove regarding the removal of metal layer 310.

Figure 13:
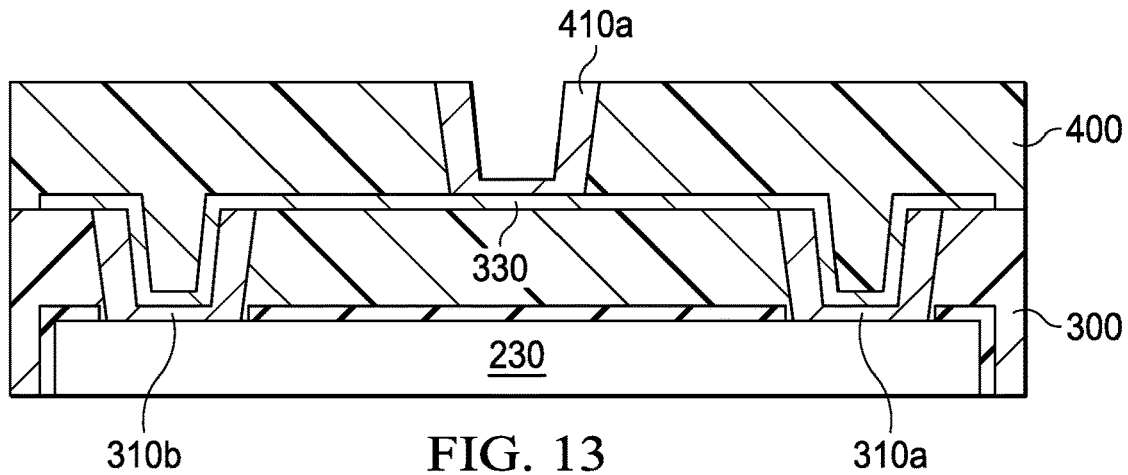
Figure 14:
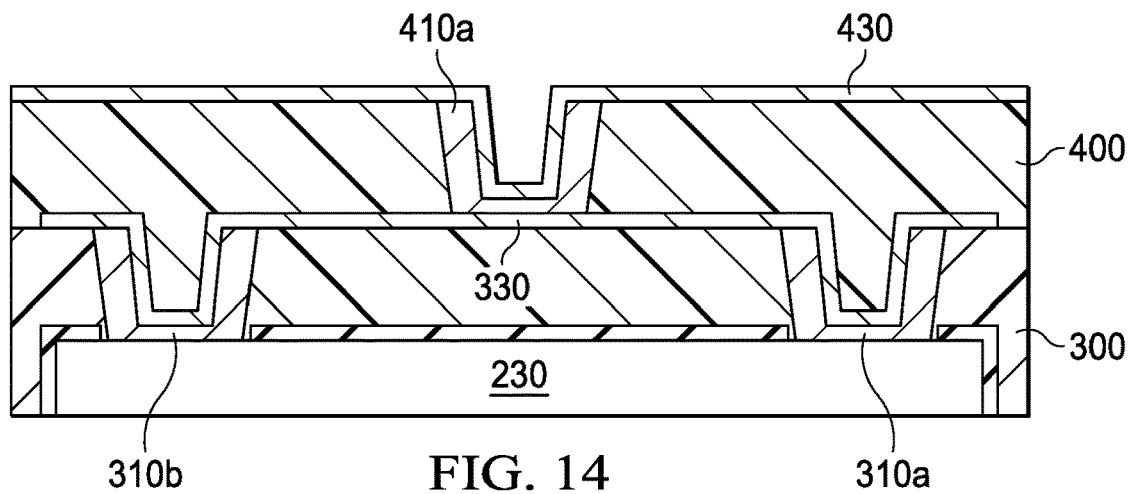
Figure 15:
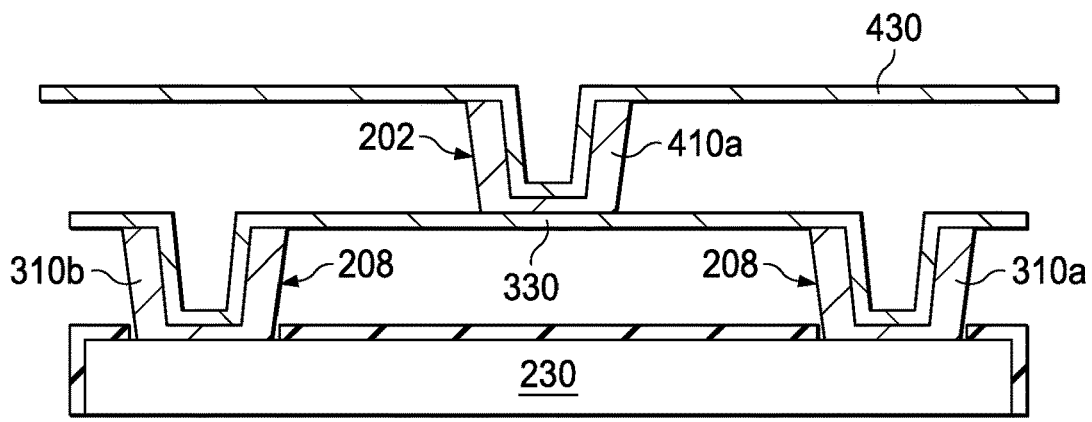
FIG. 15 shows the resulting vias formed by the process flow illustrated in FIGS. 2-14 in accordance with the described examples.

The polymer plug 420a is then removed as shown in FIG. 13 and the metal within the cavity 402 is cleaned using similar processes as described hereinabove. In FIG. 14, another metal layer 430 is formed on spacer layer 400 and into the cavity 420 covering the metal 410a lining the cavity. In FIG. 15, the spacer layers 300 and 400 have been removed such as by an isotropic oxygen plasma process. The resulting structure shown in FIG. 15 shows the mirror via 202 and two bias vias 208. The same process flow can be applied to the formation of additional vias within the DMD structure.

Figure 16:
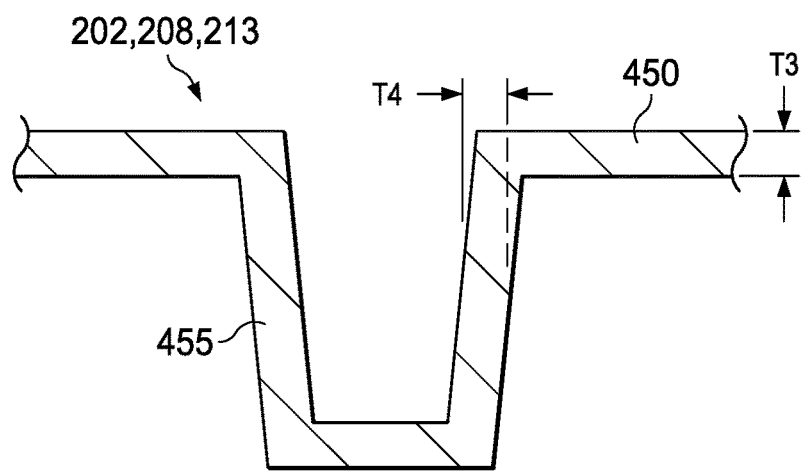
FIG. 16 shows the relative sidewall and top metal dimensions of a via made according to the described examples.

FIG. 16 illustrates a single via (e.g., via 202, 208, 213) including a planar metal layer 450 and a post 455 formed from the planar metal layer 450. The thickness of the planar metal layer 430 at the top of the via 202, 208, 213 is designated as T3, and the thickness of the post's sidewall is designated as T4. Through the process described hereinabove, the sidewall thickness T4 can be formed to be greater than 14% of T3. In other examples, T4 can be greater than 20%. Further, in some examples T4 is 28% (approximately 2/7) of T3. The multi-step process for forming the via described herein permits vias to be made for DMDs and other type of MEMS devices that are structurally more stable with lower resistance than if the sidewall thickness was less than 14% of the thickness of the metal at the top of the vias.

Modifications to the described embodiments are possible, and other embodiments are possible and within the scope of the claims.

What is claimed is:

1. A method of manufacturing a device, the method comprising:
    forming a metal layer on a layer and in a cavity in the layer;
    forming a polymer layer on the metal layer and in the cavity;
    removing a first portion of the polymer layer to leave a second portion of the polymer layer in the cavity;
    removing a first portion of the metal layer to leave a second portion of the metal layer in the cavity, after removing the first portion of the polymer layer; and
    removing the second portion of the polymer layer from the cavity, after removing the first portion of the polymer layer.

2. The method of claim 1, wherein the polymer layer is uncured.

3. The method of claim 1, wherein removing the first portion of the metal layer comprises exposing the metal layer to a metal etching plasma while the polymer layer covers the second portion of the metal layer.

4. The method of claim 1, wherein removing the first portion of the metal layer comprises wet etching the metal layer while the polymer layer covers the second portion of the metal layer.

5. The method of claim 1, wherein the metal layer is a first metal layer, the method further comprising forming a second metal layer on the layer and in the cavity over the second portion of the first metal layer.

6. The method of claim 1, wherein the layer is a first layer, the cavity is a first cavity, the polymer layer is a first polymer layer, and the method further comprises:
    forming a second layer on a second metal layer;
    forming a second cavity in the second layer;
    forming a third metal layer on the second layer and in the second cavity;
    forming a second polymer layer on the third metal layer and in the second cavity over the third metal layer in the second cavity;
    removing a first portion of the second polymer layer to leave a second portion of the second polymer layer in the second cavity;
    removing a first portion of the third metal layer to leave a second portion of the third metal layer in the second cavity;
    removing the second portion of the second polymer layer from the second cavity; and
    forming a fourth metal layer on the second layer and in the second cavity over the second portion of the third metal layer.

7. The method of claim 6, wherein the second polymer layer is uncured.

8. The method of claim 6, wherein removing the first portion of the third metal layer comprises exposing the third metal layer to a metal etching plasma while the second polymer layer covers the second portion of the third metal layer.

9. The method of claim 6, wherein removing the first portion of the third metal layer comprises wet etching the third metal layer.

10. The method of claim 6, further comprising cleaning the second portion of the third metal layer after removing the second portion of the second polymer layer and before forming the fourth metal layer on the second layer.

11. The method of claim 1, further comprising:
    forming the layer on a substrate; and
    forming the cavity in the layer.

12. The method of claim 5, further comprising cleaning the second portion of the metal layer in the cavity after removing the second portion of the layer and before forming the second metal layer on the layer.

13. The method of claim 1, wherein the polymer layer comprises photoresist, a bottom antireflective coating, or a gap filler material.

14. The method of claim 1, wherein removing the first portion of the polymer layer comprises ashing the polymer layer.

15. The method of claim 1, wherein a top surface the second portion of the polymer layer is below a top surface of the first metal layer.

16. A method of manufacturing a device, the method comprising:
   forming a first metal layer on a layer and in a cavity in the layer;
   applying photoresist on the first metal layer and in the cavity over the first metal layer;
   removing a first portion of the photoresist to leave a second portion of the photoresist in the cavity;
   removing a first portion of the first metal layer to leave a second portion of the first metal layer in the cavity, after removing the first portion of the photoresist;
   removing the second portion of the photoresist from the cavity, after removing the first portion of the first metal layer;
   forming a second metal layer on the layer and in the cavity over the second portion of the first metal layer; and
   removing the layer to form a metal via, the metal via having a sidewall;
   a thickness of the sidewall of the metal via being least 20% of a thickness of the second metal layer outside the metal via.

17. The method of claim 16, wherein the thickness of the sidewall of the metal via is least 28% of the thickness of the second metal layer outside the metal via.

18. The method of claim 16, wherein removing the first portion of the first metal layer comprises exposing the first metal layer to a metal etching plasma.

19. The method of claim 16, wherein removing the first portion of the first metal layer comprises wet etching the first metal layer.

20. The method of claim 16, further comprising cleaning the second portion of the first metal layer in the cavity after removing the first portion of the photoresist and before forming the second metal layer on the layer.

* * * * *